United States Patent
Shim (10) Patent No.: US 11,812,631 B2
(45) Date of Patent: Nov. 7, 2023

(54) ELECTROLUMINESCENCE DISPLAY WITH SILVER CONDUCTIVE LAYER COVERING EXPOSED ALIMINUM LAYER TO PREVENT CORROSION AND MANUFACTURING METHOD FOR THE SAME

(71) Applicant: LG Display Co., Ltd., Seoul (KR)

(72) Inventor: Seokho Shim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 409 days.

(21) Appl. No.: 17/127,274

(22) Filed: Dec. 18, 2020

(65) Prior Publication Data

US 2021/0202902 A1 Jul. 1, 2021

(30) Foreign Application Priority Data

Dec. 31, 2019 (KR) .................. 10-2019-0180057

(51) Int. Cl.
*H10K 50/844* (2023.01)
*H10K 59/131* (2023.01)
*H10K 71/00* (2023.01)
*H10K 59/12* (2023.01)
*H10K 102/00* (2023.01)

(52) U.S. Cl.
CPC ......... *H10K 50/844* (2023.02); *H10K 59/131* (2023.02); *H10K 71/00* (2023.02); *H10K 59/1201* (2023.02); *H10K 2102/311* (2023.02)

(58) Field of Classification Search
CPC .. H10K 50/844; H10K 59/12; H10K 59/1201; H10K 59/131; H10K 59/873; H10K 71/00; H10K 71/40; H10K 71/421; H10K 71/441; H10K 2102/311
USPC .......................................................... 257/72
See application file for complete search history.

(56) References Cited

U.S. PATENT DOCUMENTS

| | | | |
|---|---|---|---|
| 2018/0182838 A1* | 6/2018 | Yeo | H10K 50/844 |
| 2020/0243782 A1* | 7/2020 | Maruyama | H10K 59/126 |
| 2022/0115626 A1* | 4/2022 | Saitoh | H05B 33/06 |
| 2022/0190288 A1* | 6/2022 | Sonoda | H10K 71/00 |

\* cited by examiner

*Primary Examiner* — Matthew E. Gordon
(74) *Attorney, Agent, or Firm* — Morgan, Lewis & Bockius LLP

(57) ABSTRACT

The electroluminescence display device according to an embodiment of the present specification may include the substrate divided into a display area and a non-display area, the power supply line disposed in the non-display area for supplying power supplied to the display area, the first insulating film disposed on the power supply line and overlapping a part of the power supply line and having an open area where a part of the power supply line is exposed, and the conductive film covering the first insulating film and the power supply line in the open area.

17 Claims, 11 Drawing Sheets

ELECTROLUMINESCENCE DISPLAY WITH SILVER CONDUCTIVE LAYER COVERING EXPOSED ALIMINUM LAYER TO PREVENT CORROSION AND MANUFACTURING METHOD FOR THE SAME

CROSS REFERENCE TO RELATED APPLICATION

This application claims priority from Korean Patent Application No. 10-2019-0180057, filed on Dec. 31, 2019, which is hereby incorporated by reference for all purposes as if fully set forth herein.

BACKGROUND

1. Technical Field

The present disclosure relates to relates to an electroluminescence display device and a manufacturing method thereof, and more particularly, to an electroluminescence display device having improved reliability and a manufacturing method thereof.

2. Discussion of the Related Art

As the information society develops, demands for display devices for displaying images are increasing in various forms, and various types of display devices, such as a liquid crystal display device (LCD) and an electroluminescence display device (ELD) have been developed.

The electroluminescence display device (ELD) may include a Quantum Dot (QD) Light Emitting Display device with a quantum Dot (QD), an inorganic light emitting display device, and an organic light emitting display device and so on.

Such an electroluminescence display device may prevent foreign matter and moisture from penetrating the light emitting device by using an encapsulation layer.

However, when a crack occurs in the encapsulation layer in the electroluminescence display device, there may be a problem that moisture may penetrate.

SUMMARY

Accordingly, embodiments of the present disclosure are directed to an electroluminescence display device and a manufacturing method for the same that substantially obviates one or more of the problems due to limitations and disadvantages of the related art.

The present disclosure provides an electroluminescence display device capable of suppressing the crack generation and prevention the moisture from penetrating, and a method for manufacturing the same.

An aspect of embodiments of the present disclosure is to provide an electroluminescence display device and a method for manufacturing the same, which can suppress cracks from being generated in the encapsulation layer.

Another aspect of embodiments of the present disclosure is to provide an electroluminescence display device and a method of manufacturing the same, which can settle the problem of reliability deterioration due to erosion or electro-corrosion of wirings or lines.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an electroluminescence display device comprises: a substrate divided into a display area and a non-display area; a power supply line disposed in the non-display area for supplying power supplied to the display area; a first insulating film disposed on the power supply line and overlapping a portion of the power supply line and having an open area where a part of the power supply line is exposed; and a conductive film covering the first insulating film and the power supply line in the open area.

In another aspect, there may be provided with an electroluminescence display device comprises: disposing, on a substrate divided into a display area and a non-display area, a power supply line for supplying power supplied to the display area on the non-display area; disposing a first insulating film on the upper portion of the power supply line, the first insulating film having an open area overlapping a portion of the power supply line and exposing a part of the power supply line; and disposing a conductive film covering the first insulating film and the power supply line in the open area.

According to the electroluminescence display device and a method of manufacturing the same based on the embodiment of the present specification, there is an effect of providing a light emitting display device capable of improving the problem of reliability deterioration due to erosion or electro-corrosion of wirings or lines.

In addition, there is an effect of preventing moisture from entering through the outer portion of the electroluminescence display device.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear. The terms such as "including", "having", "containing", "comprising of", and "comprising" used herein are generally intended to allow other components to be added unless the terms are used with the term "only". Singular forms used herein are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Spatially relative terms, such as, "on", "over", "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as "directly", "only" are used.

Time relative terms, such as "after", "subsequent to", "next to", "before", or the like, used herein to describe a temporal relationship between events, operations, or the like are generally intended to include events, situations, cases, operations, or the like that do not occur consecutively unless the terms, such as "directly", "immediately", or the like, are used.

In the case of the description of the flow relationship of the signal, for example, the term of 'the signal is transmitted from node A to node B may also be interpreted as including a case where a signal is transmitted from the A node to the B node via another node, unless the terms of 'right' or 'direct' are used.

When the terms, such as "first", "second", or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

Figure 1:
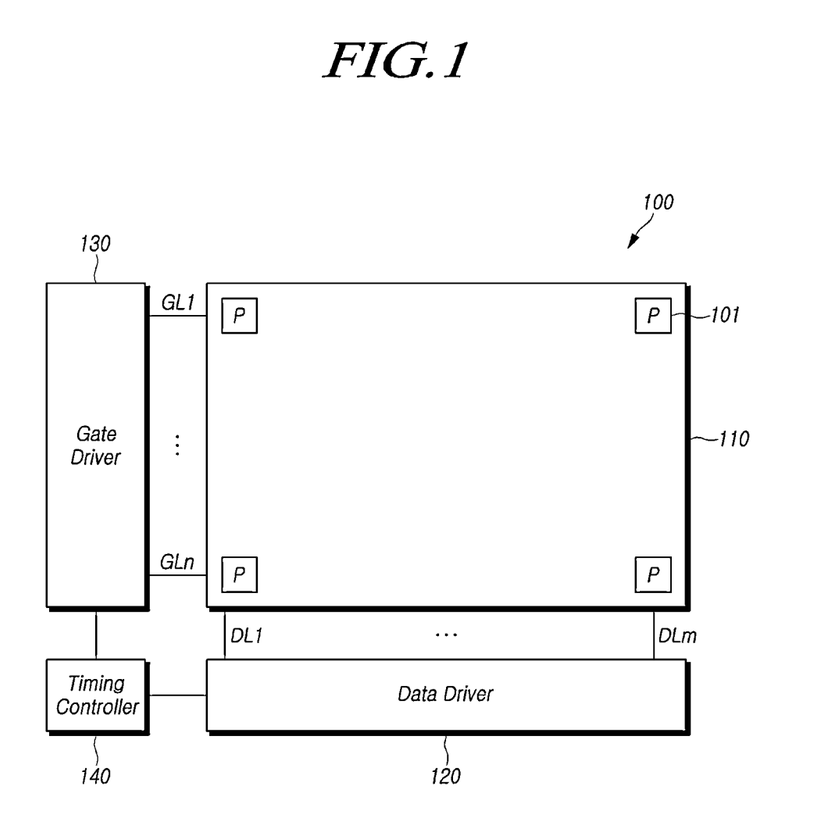
FIG. 1 is a structural diagram illustrating a structure of an electroluminescence display device according to embodiments of the present invention.

FIG. 1 is a structural diagram illustrating a structure of an electroluminescence display device according to embodiments of the present invention.

Referring to FIG. 1, the electroluminescence display device 100 may include a display panel 110, a data driver 120, a gate driver 130, and a timing controller 140.

The display panel 110 may include a plurality of data lines DL1 to DLm extending in the first direction and a plurality of gate lines GL1 to GLn extending in the second direction. Here, the first direction and the second direction may be orthogonal, but are not limited thereto.

In addition, the display panel 110 may include a plurality of pixels (P) 101. The plurality of pixels 101 is connected to the plurality of data lines DL1 to DLm and the plurality of gate lines GL1 to GLn, and one pixel 101 may operate by receiving a data signal transmitted through a connected data line in response to a gate signal transmitted through a connected gate line.

The data driver 120 may be connected to the plurality of data lines DL1 to DLm and may supply the data signal to the plurality of pixels through the plurality of data lines DL1 to DLm. The data driver 120 may include a plurality of source drivers. Each of the plurality of source drivers may be implemented as an integrated circuit. The data signal transmitted by the data driver 120 may be applied to the pixel.

The gate driver 130 is connected to the plurality of gate lines GL1 to GLn and can supply the gate signal to the plurality of gate lines GL1 to GLn. The pixel 101 receiving the gate signal through the gate line may receive the data signal.

Although the gate driver 130 is illustrated as being disposed outside the display panel 110, the gate driver 130 may be not limited thereto, and the gate driver 130 may include a gate signal generator disposed in the display panel 110. Further, the gate driver 130 may be implemented with a plurality of integrated circuits.

In addition, although the gate driver 130 is illustrated as being disposed on one side of the display panel 110, the gate driver 130 is not limited thereto, and the gate driver 130 may be disposed on both sides of the display panel 110. The gate driver disposed on the left side may be connected to the odd-numbered gate line, and the gate driver disposed on the right side of the display panel 110 may be connected to the even-numbered gate line.

The timing controller 140 may control the data driver 120 and the gate driver 130. The timing controller 140 may supply a data control signal to the data driver 120 and a gate control signal to the gate driver 130. The data control signal or gate control signal may include a clock, a vertical synchronization signal, a horizontal synchronization signal, and a start pulse. However, the signal output from the timing controller 140 is not limited thereto.

In addition, the timing controller 140 may supply a video signal to the data driver 120. The data driver 120 may generate the data signals through the video signals and data control signals received from the timing controller 140 and supply the data signals to the plurality of data lines.

Figure 2:
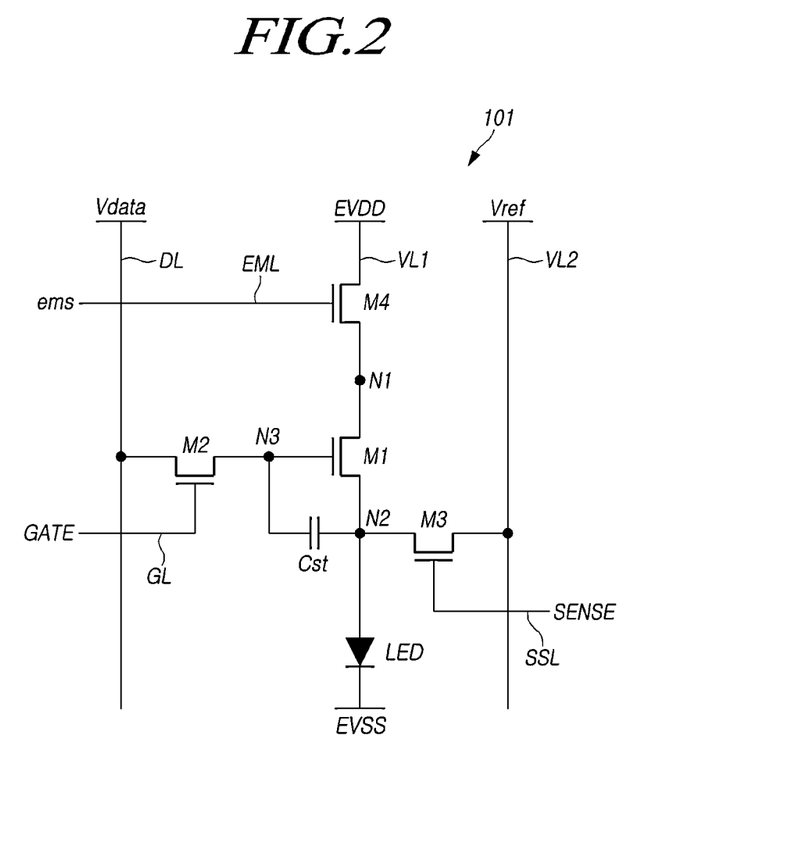
FIG. 2 is a circuit diagram illustrating a pixel according to embodiments of the present invention.

FIG. 2 is a circuit diagram illustrating a pixel according to embodiments of the present invention.

Referring to FIG. 2, the pixel 101 may include a first transistor M1, a second transistor M2, a third transistor M3, a fourth transistor M4, a storage capacitor Cst, and a light emitting element LED.

The first electrode of the first transistor M1 may be connected to the first node N1 connected to the first power line VL1 through which the first power EVDD is transmitted, and the second electrode may be connected to the second node N2. The gate electrode of the first transistor M1 may be connected to the third node N3. The first transistor M1 may cause the driving current to flow to the second electrode by the first power EVDD supplied to the first node N1 in response to the voltage applied to the gate electrode.

The first electrode of the second transistor M2 may be connected to the data line DL transferring the data voltage Vdata, and the second electrode may be connected to the third node N3. In addition, the gate electrode of the second transistor M2 may be connected to the gate line GL supplying the gate signal GATE. The second transistor M2 may receive the gate signal GATE and supply the data voltage Vdata transferred to the data line DL to the gate electrode of the first transistor M1. The gate signal may be supplied from the gate driver 130 shown in FIG. 1.

The first electrode of the third transistor M3 may be connected to the reference voltage line VL2 transferring the reference voltage Vref, and the second electrode may be connected to the second node N2. Also, the gate electrode of the third transistor M3 may be connected to the sensing line SSL. The third transistor M3 may receive the sense signal SENSE and apply the reference voltage Vref transferred to the reference voltage line VL2 to the second electrode of the first transistor M1. The second node N2 may be initialized by the reference voltage Vref. The sense signal SENSE may be supplied from the gate driver 130 shown in FIG. 1. Also, the data signal may be supplied from the data driver 120 shown in FIG. 1.

The first electrode of the fourth transistor M4 may be connected to the first power line VL1 transferring the first power EVDD, and the second electrode may be connected to the first node N1. In addition, the gate electrode of the fourth transistor M4 may be connected to an emission line EML supplying the emission signal ems. The fourth transistor M4 may receive the emission signal ems and supply the first power EVDD transferred to the first power line to the first node N1. The emission signal may be supplied from the gate driver 130 shown in FIG. 1.

The first electrode of the storage capacitor Cst may be connected to the third node N3, and the second electrode may be connected to the second node N2. That is, the storage capacitor Cst may be disposed between the gate electrode of the first transistor M1 and the second electrode of the first transistor M1, so that the voltage difference between the gate electrode of the first transistor M1 and the second electrode of the first transistor M1 can be maintained.

The anode electrode of the light emitting element LED may be connected to the second node N2, and the cathode electrode may be connected to the second power EVSS. The voltage level of the second power EVSS may be lower than the voltage level of the first power EVDD. The light emitting element LED may emit light in response to a current flowing from the anode electrode to the cathode electrode. The light emitting element LED may include a light emitting layer that emits light by a current flowing between the anode electrode and the cathode electrode. The light emitting layer may be at least one of an organic material, an inorganic material, and a quantum-dot material.

In the pixel 101 configured as described above, the first to fourth transistor M1 to M4 may be N-type transistors, also the first to fourth transistor M1 to M4 may be a P-type transistor. However, it is not limited thereto. In addition, the first and second electrodes of the first to fourth transistors M1 to M4 may be drain electrodes and source electrodes, respectively. However, it is not limited thereto.

Figure 3:
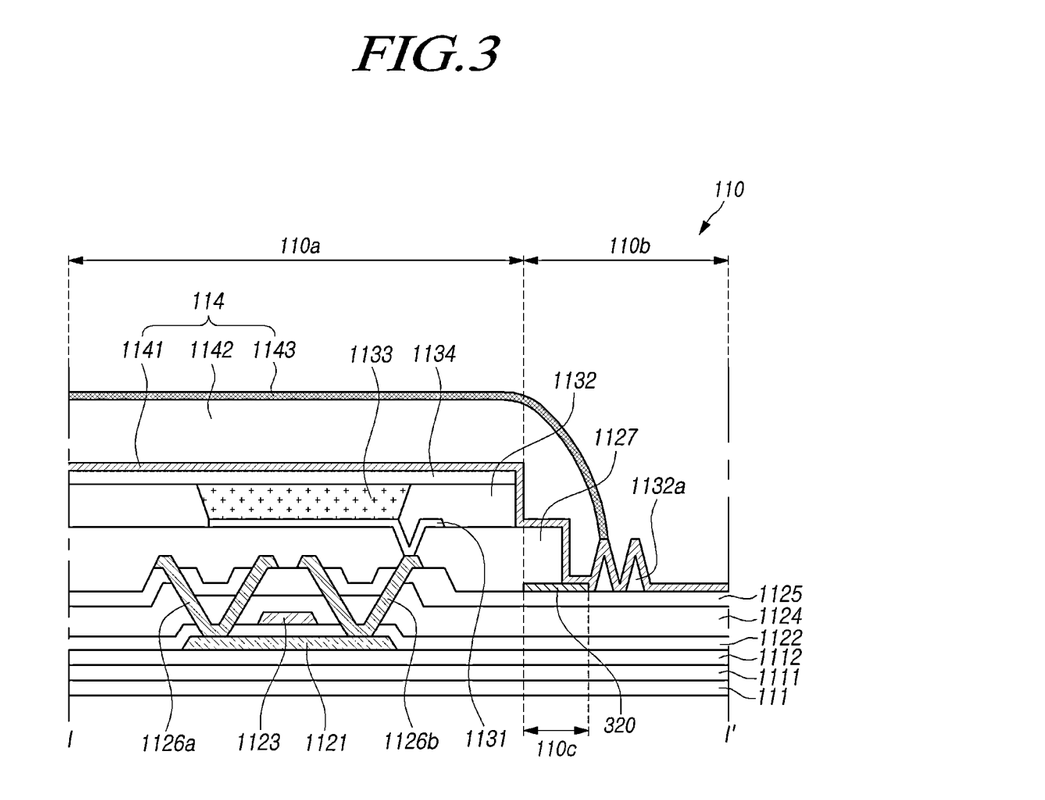
FIG. 3 is a cross-sectional view illustrating a cross-section of the electroluminescence display device according to embodiments of the present invention.

FIG. 3 is a cross-sectional view illustrating a cross-section of the electroluminescence display device according to embodiments of the present invention.

Referring to FIG. 3, a multi-buffer layer 1111 may be formed on the substrate 111 of the electroluminescence display device 100, and an active buffer layer 1112 may be formed on the multi-buffer layer 1111. The multi-buffer layer 1111 and the active buffer layer 1112 may be collectively referred to as a buffer layer. The substrate 111 may include polyamide (PI). The substrate 111 may be made of a flexible material. Here, the flexible may mean that the substrate 111 can be folded or bent.

The active layer 1121 may be patterned and disposed on the active buffer layer 1112. The multi-buffer layer 1111 and the active buffer layer 1112 can prevent foreign substances present in the substrate 111 from penetrating into the active layer 1121. The multi-buffer layer 1111 may include a plurality of inorganic films, and each inorganic film may include silicon dioxide ($SiO_2$) and silicon nitride ($SiN_x$). In addition, the active buffer layer 1112 may include an inorganic film, and the inorganic film may include silicon dioxide ($SiO_2$).

The gate insulating film 1122 may be disposed on the active layer 1121. In addition, the gate electrode 1123 may be disposed by depositing and patterning a gate metal on the gate insulating film 1122. The gate insulating film 1122 may include silicon dioxide ($SiO_2$). The first interlayer insulating film 1124 and the second interlayer insulating film 1125 sequentially stacked may be disposed on the gate electrode 1123.

The first interlayer insulating film 1124 may include silicon dioxide ($SiO_2$) and silicon nitride ($SiN_x$), and the second interlayer insulating film 1125 may include silicon dioxide ($SiO_2$) and silicon nitride ($SiN_x$). The source drain metal may be patterned on the second interlayer insulating film 1125 to form the drain electrode 1126a and the source electrode 1126b. The planarization film (or protective layer) 1127 may be disposed on the drain electrode 1126a and the source electrode 1126b.

In addition, the anode electrode 1131 may be disposed on the planarization film 1127. Further, a contact hole may be formed in the planarization film 1127 and the anode electrode 1131 may be connected to the source electrode 1126b through the contact hole. Here, the source electrode 1126b is illustrated as being connected to the anode electrode 1131, but is not limited thereto. In the case of a P-type transistor, the drain electrode may be connected to the anode electrode 1131. The planarization film 1127 may include photo acryl (RAC). However, it is not limited thereto.

In addition, the bank 1132 may be formed on the planarization film 1127. The bank 1132 may cover the outer portion of the anode electrode 1131. Therefore, the anode electrode 1131 may not be obscured by the bank 1132. The portion where the anode electrode 1131 is not covered by the bank 1132 may be referred to as the cavity. In addition, a light emitting film 1133 may be formed in the cavity. Here, the light emitting film 1133 is illustrated as one film, but is not limited thereto, and may include a plurality of light emitting films. The cathode electrode 1134 may be formed on the light emitting film 1133. The cathode electrode 1134 may be a common electrode. The light emitting film 1133 may have the same meaning as a light emitting layer.

The encapsulation layer 114 may be disposed on the cathode electrode 1134. The encapsulation layer 114 may include the first inorganic film 1141, the second inorganic film 1143, and the organic film 1142 disposed between the first inorganic film 1141 and the second inorganic film 1143. The organic film 1142 may be disposed to be thicker than the first inorganic film 1141 and the second inorganic film 1143. The encapsulation layer 114 may prevent foreign matter from penetrating the light emitting film 1133.

A double dam 1132a may be formed on the substrate 111 to prevent the organic film 1142 from being discharged to the outside, and the first inorganic film 1141 may cover the upper portion of the dam 1132a. In addition, one end of the second inorganic film 1143 may meet the first inorganic film 1141 at the dam 1132a. Dam 1132a may include the same material as bank 1132. However, it is not limited thereto.

In addition, a wiring region 110c in which the power supply line 320 is disposed may be positioned under the bank 1132 inside the dam 1132a. A portion of the bank 1132 and the power supply line 320 may overlap.

Figure 4:
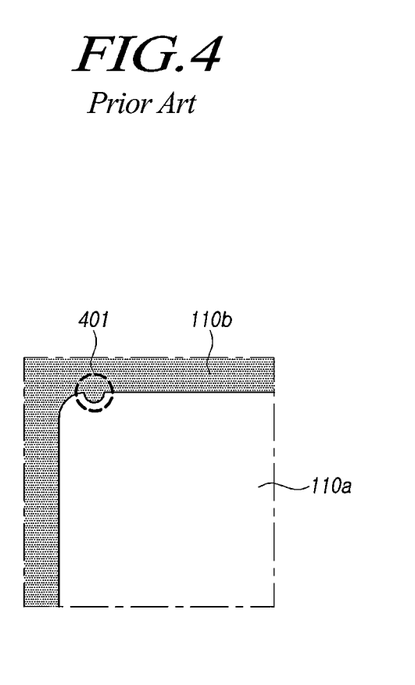
FIG. 4 is a plan view illustrating the outer periphery of the electroluminescence display device.
Figure 5:
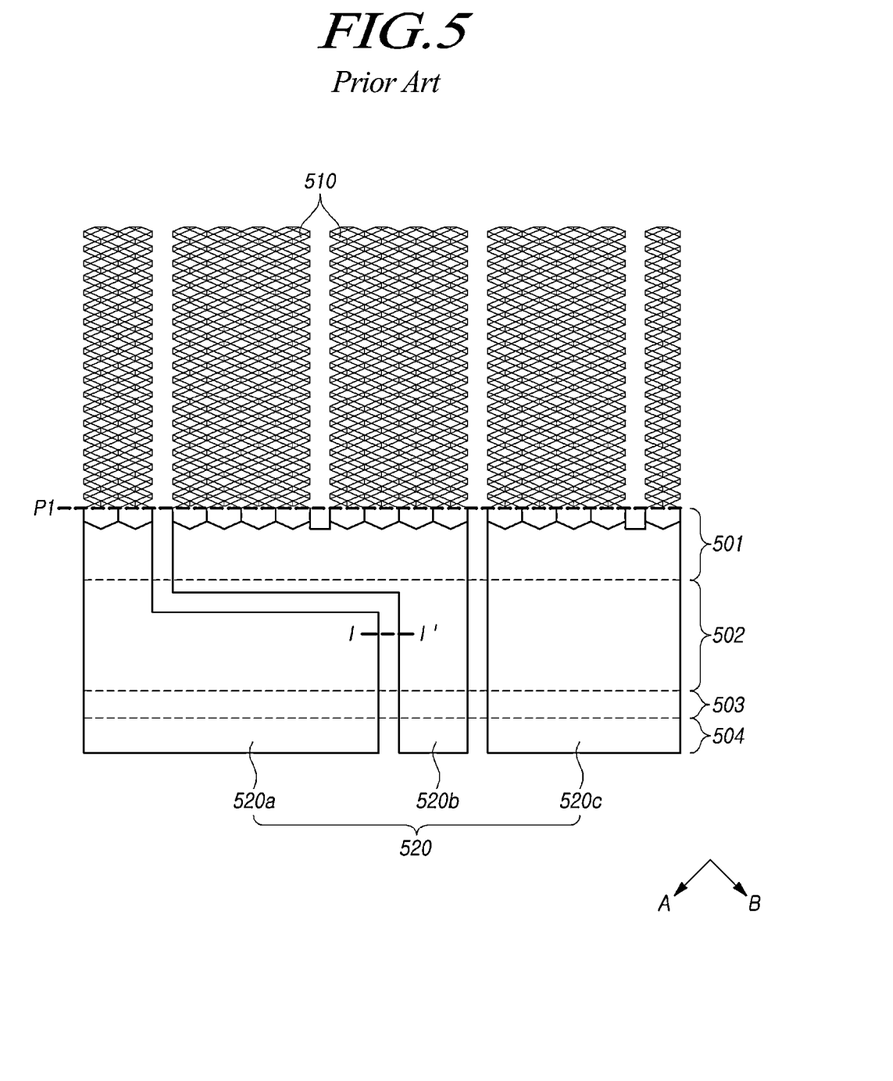
FIG. 5 is a plan view illustrating an enlarged portion of the outer portion shown in FIG. 4.
Figure 6:
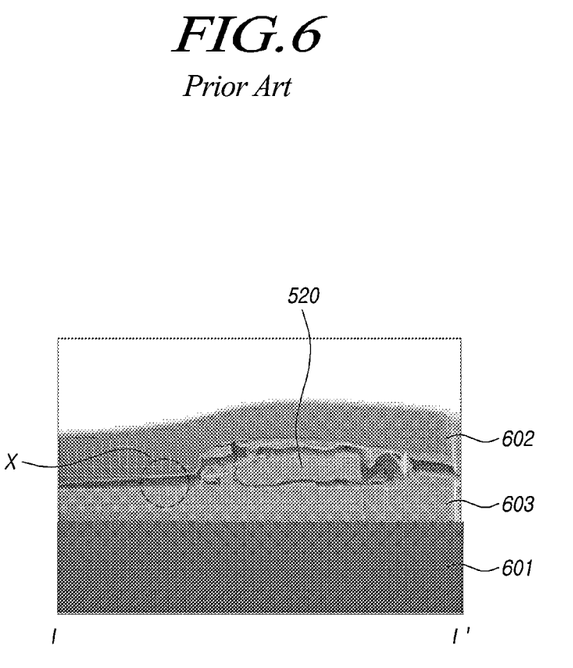
FIG. 6 is a cross-sectional view showing a cross-section of the cutting line I-I' in FIG. 5.
Figure 7:
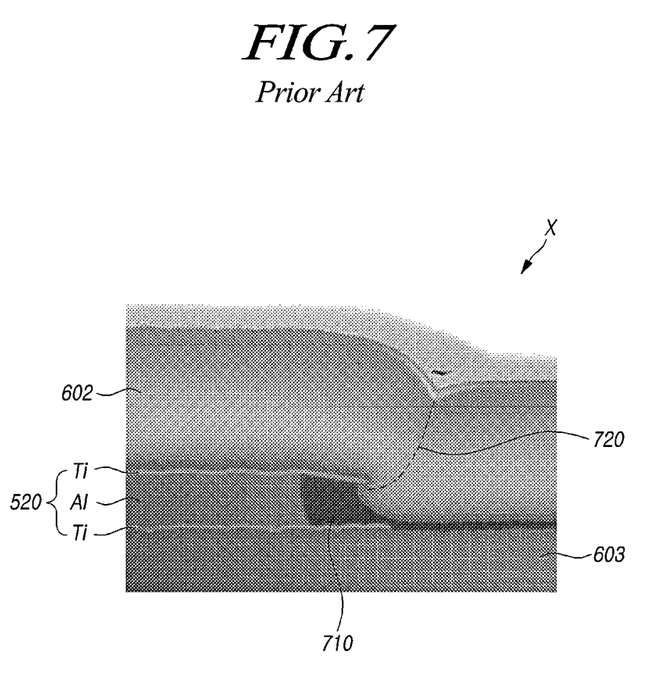
FIG. 7 is a cross-sectional view showing an enlarged cross-section of part of FIG. 6.

FIG. 4 is a plan view illustrating the outer periphery of the electroluminescence display device, and FIG. 5 is a plan view illustrating an enlarged portion of the outer portion shown in FIG. 4. FIG. 6 is a cross-sectional view showing a cross-section of the cutting line I-I' in FIG. 5, and FIG. 7 is a cross-sectional view showing an enlarged cross-section of part of FIG. 6.

Referring to FIGS. 4 to 7, the electroluminescence display device 100 may be divided into the display area 110a and the non-display area 110b. In addition, the power supply line 520 and the power link line 510 for transferring power to the power supply line 520 may be disposed in the non-display area 110b. The power supply line 520 may include the first power supply line 520a connected to the first power line supplying first power EVDD, the second power supply line 520b connected to the cathode electrode supplying the second power EVSS, and the reference voltage supply line 520c connected to the reference voltage line supplying the reference voltage. The first power supply line 520a, the second power supply line 520b, and the reference voltage supply line 520c may be spaced apart from each other.

In addition, the power link line 510 may be connected to the first power supply line 520a, the second power supply line 520b, and the reference voltage supply line 520c, respectively. In the power link line 510, a bending pattern including two wires extending alternately in the first direction (A) and the second direction (B) and crossing each other may be disposed. In addition, the upper region based on the dotted line P1 in which the power link line 510 is disposed may be the bending area.

The electroluminescence display device 100 may be bent or folded in this bending area. Even if the electroluminescence display device 100 is bent or folded in the bending area, the disconnection of the power link line 510 may be suppressed by the bending pattern.

In addition, in the electroluminescent display device 100, the areas in which the first power supply line 520a, the second power supply line 520b, and the reference voltage supply line 520c are disposed may be divided into the first area 501, the second area 502, the third area 503 and the fourth area 504, respectively. In the first area 501 and the third area 503, the planarization film 1127 shown in FIG. 3 may not be placed on the first power supply line 520a, the second power supply line 520b, and the reference voltage supply line 520c. In addition, in the second area 502 and the fourth area 504, the planarization film 1127 shown in FIG. 3 may be disposed on the first power supply line 520a, the second power supply line 520b, and the reference voltage supply line 520c. Since the planarization film 1127 has a moisture-permeable characteristic, moisture can be delivered through the planarization film 1127 in a direction from the bending area to the display area. Accordingly, when the planarization film 1127 is not disposed in the first area 501 and the third area 503, moisture may not be transferred to the display area by the first area 501 and the third area 503.

In addition, the encapsulation layer 602 may be disposed in the display area 110a and the non-display area 110b. In addition, the first power supply line 520a, the second power supply line 520b, the reference voltage supply line 520c, and the power link line 510 may be disposed at least partially in the wiring area 110c shown in FIG. 3 of the non-display area 110b.

In the non-display area 110b, the substrate 601 and the interlayer insulating film 603 provided when forming the transistor on the substrate 601 may be disposed. In addition, the power supply line 520 may be disposed on the interlayer insulating film 603. Also, the encapsulation layer 602 may be disposed on the power supply line 520. As illustrated in the first area X, a film lifting phenomenon in which the encapsulation layer 602 is lifted without contact with the interlayer insulating film 603 may occur due to electro-corrosion.

FIG. 4 illustrates an enlarged view of the display area 110a and the non-display area 110b of the substrate. By the electrophoresis, a gap portion of the films may be formed at the boundary between the display region 110a and the non-display region 110b, and moisture may penetrate into the gap portion of the films. In addition, when the electroluminescence display device 100 is operated, light may not emit light in an area where moisture penetrates in the display area 110a, so that a black spot 401 may occur.

FIG. 7 illustrates the process of moisture penetration in more detail. The power supply line 520 may be made of, for example, the triple layer of titanium (Ti)/aluminum (Al)/ titanium (Ti), and the anode electrode 1131 shown in FIG. 3 may be formed by patterning by an etching process after the power supply line 520 is deposited. When the anode electrode 1131 is formed, aluminum (Al) of the power supply line 520 may be eroded by the etching process.

When aluminum (Al) is eroded, a predetermined empty space 710 may be formed in a region where the power supply line 520 is to be formed on the substrate 111. Deformation may occur in the power supply line 520 due to the empty space 710. In addition, when the encapsulation layer 602 is disposed on the power supply line 520, the crack 720 may occur in the encapsulation layer 602 due to deformation of the power supply line 520 by the empty space 710. In addition, the crack 720 formed in the encapsulation layer 602 may be a path through which moisture penetrates.

Figure 8:
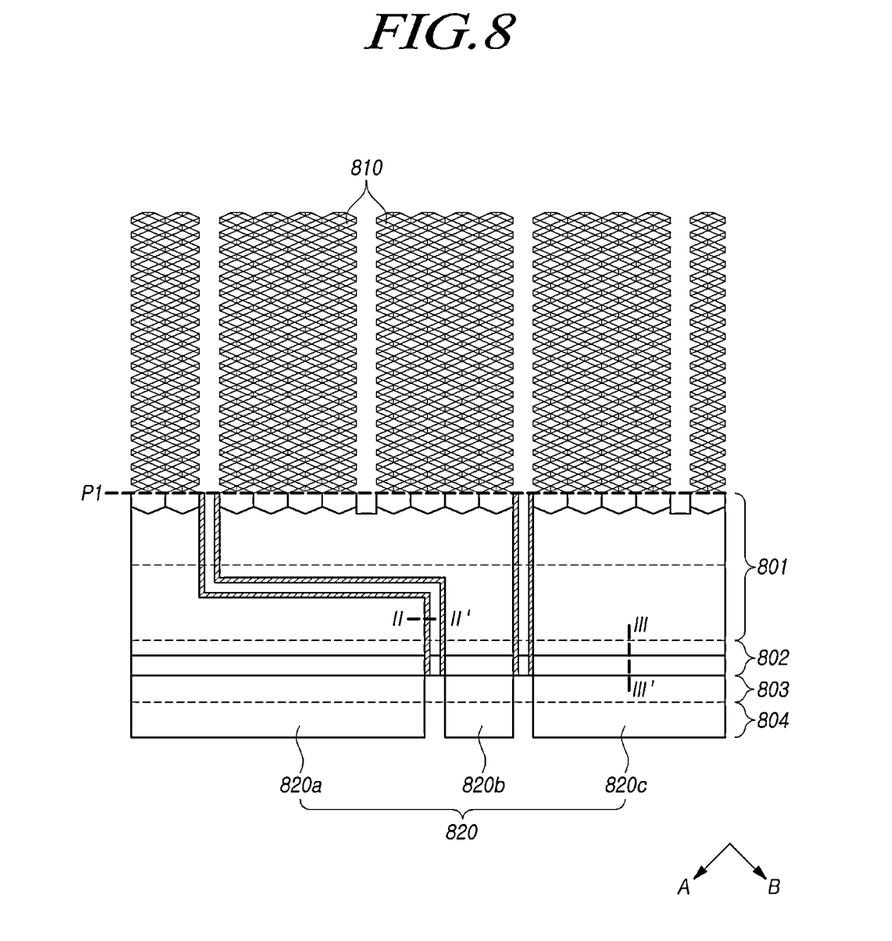
FIG. 8 is a plan view illustrating a part of an outer portion of the electroluminescence display device according to the present invention.
Figure 9:
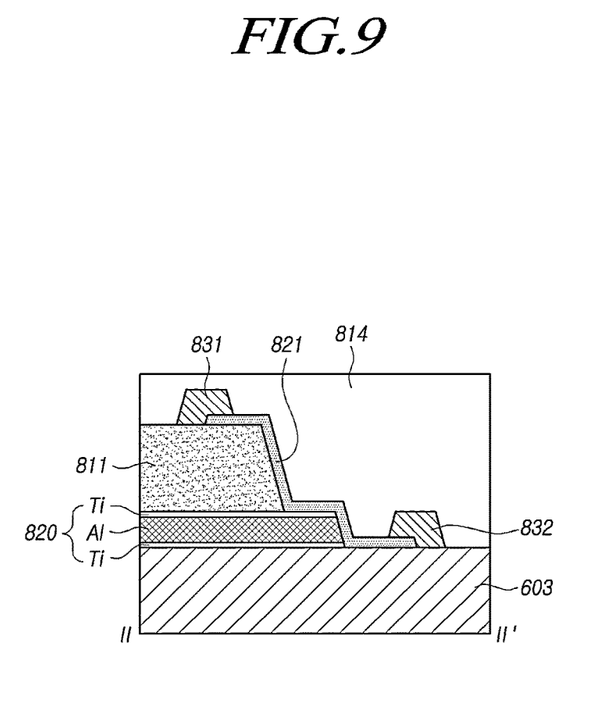
FIG. 9 is a cross-sectional view illustrating a cross-section of cutting line II-II' of FIG. 8 in the electroluminescence display device according to the present invention.
Figure 10:
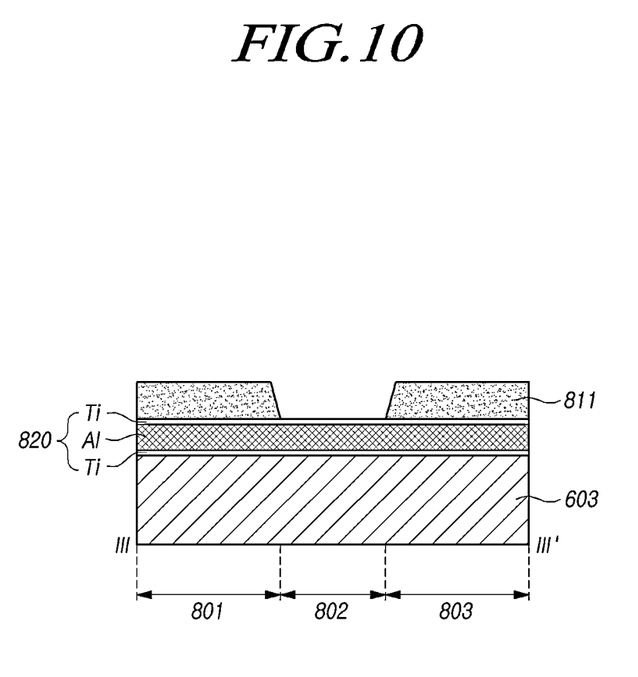
FIG. 10 is a cross-sectional view illustrating a cross-section of the cutting line III-III' of FIG. 8 in the electroluminescence display device according to the present invention.

FIG. 8 is a plan view illustrating a part of an outer portion of the electroluminescence display device according to the present invention, FIG. 9 is a cross-sectional view illustrating a cross-section of cutting line II-II' of FIG. 8 in the electroluminescence display device according to the present invention. FIG. 10 is a cross-sectional view illustrating a cross-section of the cutting line III-III' of FIG. 8 in the electroluminescence display device according to the present invention.

Referring to FIGS. 8 to 10, the power supply line 820 for supplying power supplied to the display area may be disposed on the interlayer insulating film 603 in the non-display area. In addition, the power link line 810 for transferring power to the power supply line 820 may be connected to the power supply line 820.

The power supply line 820 may include the first power supply line 820a connected to the first power line for supplying first power EVDD, the second power supply line 820b connected to the cathode electrode for supplying the second power EVSS, and the reference voltage supply line 820c connected to the reference voltage line for supplying the reference voltage. However, it is not limited thereto. In addition, the first power supply line 820a, the second power supply line 820b, and the reference voltage supply line 820c may be spaced apart from each other.

The power supply line 820 may include three overlapping metal layers. The power supply line 820 may include, for example, titanium (Ti)/aluminum (Al)/titanium (Ti). However, it is not limited thereto.

In addition, the power link line 810 may be connected to the first power supply line 820a, the second power supply line 820b, and the reference voltage supply line 820c, respectively. The power link line 810 may include the bending pattern including two wires extending alternately in the first direction (A) and the second direction (B) to cross each other. In addition, the region on the dotted line P1 in which the power link line 810 is disposed in FIG. 8 may be the bending area.

The electroluminescence display device 100 may be bent or folded in this bending area where the power link line 810 is disposed. Even if the electroluminescence display device 100 is bent or folded in the bending area, the disconnection of the power link line 810 may be suppressed by the bending pattern.

In addition, the first insulating film 811 may be disposed on the power supply line 820. The first insulating film 811 may include photo acryl (PAC). However, it is not limited thereto. Also, the first insulating film 811 may be the planarization film 1127 illustrated in FIG. 3.

In addition, in the electroluminescent display device 100, the areas in which the first power supply line 820a, the second power supply line 820b, and the reference voltage supply line 820c are disposed may he divided into the first area 801, the second area 802, the third area 803 and the fourth area 804, respectively. In the first area 801 and the third area 803, the planarization film 1127 shown in FIG. 3 may not be placed on the first power supply line 820a, the second power supply line 820b, and the reference voltage supply line 820c. In addition, in the second area 802 and the fourth area 804, the planarization film 1127 may be disposed on the first power supply line 820a, the second power supply line 820b, and the reference voltage supply line 820c. The fourth area 804 may be disposed closer to the display area than the first area 801.

In addition, the conductive film 821 covering the first insulating film and the power supply line 820 may be disposed on the first insulating film and the power supply line 820. The conductive film 821 may cover the inclined surfaces of the first insulating film 811 and the power supply line 820.

In addition, the open area, which overlaps a part of the power supply line 820 and in which the first insulating film 811 does not cover the power supply line 820, may be formed in the first insulating film 811. Moisture transfer through the first insulating film 811 may be prevented by the open area.

The conductive film 821 may have a structure in which three metal layers are overlapped. The conductive film 821 may include a triple layer of a transparent electrode/silver/transparent electrode. The transparent electrode may include Induim Tin Oxide(ITO). However, it is not limited thereto.

The conductive film 821 may be formed together when the anode electrode 1131 shown in FIG. 4 is formed. In addition, the conductive film 821 may include the same material as the anode electrode 1131. However, it is not limited thereto. The conductive film 821 may prevent the power supply line 820 from being eroded when forming the anode electrode 1131. In particular, the silver included in the conductive film 821 has less reactive characteristics than the aluminum (Al) included in the power supply line 820, and thus can prevent erosion of the power supply line 820.

In addition, aluminum (Al) is vulnerable to electro-corrosion, but since the conductive film 821 including a material resistant to electro-corrosion, such as silver, is disposed, the generation of electro-corrosion can be suppressed. Therefore, the film lifting phenomenon due to the electro-corrosion can be prevented.

The conductive film 821 may be formed in the first area 801 and the second area 802 and may not be formed in the third area 803 and the fourth area 804.

Since the planarization film 1127 has a moisture-permeable characteristic, moisture can be delivered through the planarization film 1127 in a direction from the bending area to the display area. Accordingly, when the planarization film 1127 is not disposed in the first area 801 and the third area 803, moisture may not be transferred to the display area by the first area 801 and the third area 803.

When moisture penetrates in the direction of the fourth area 804 from the power link line 810, the first insulating film 811 has the water-absorbable property, so the moisture may be transferred to the light emitting element LED through the first insulating film 811. However, since the conductive film 821 covering the first insulating film 811 is disposed in the first area 801 and the second area 802, moisture may be prevented from being transferred to the light emitting element LED. In addition, since the first insulating film 811 is not disposed on the second area 802, the moisture delivery through the first insulating film 811 may not occur. Therefore, since the moisture does not pass over the second area 802, the conductive film 821 may not be disposed in the third area 803 and the fourth area 804.

In addition, the second insulating films 831 and 832 may be disposed at one end and the other end of the conductive film 821, respectively. One second insulating film 831 may be disposed on the first insulating film 811 and the other second insulating film 832 may be disposed on the interlayer insulating film 603. The second insulating films 831 and 832 may be simultaneously formed when forming the bank 1132 illustrated in FIG. 3. Also, the second insulating films 831 and 832 may include the same material as the bank 1132. In addition, the conductive film 821 may be fixed by the second insulating films 831 and 832.

In addition, the encapsulation layer 814 may be disposed on the second insulating films 831 and 832. Erosion of the power supply line 820 may not occur by the conductive film 821, so that a predetermined space due to erosion of the power supply line 820 may not be formed. Therefore, the cracks may not be generated in the encapsulation layer 814.

Figure 11:
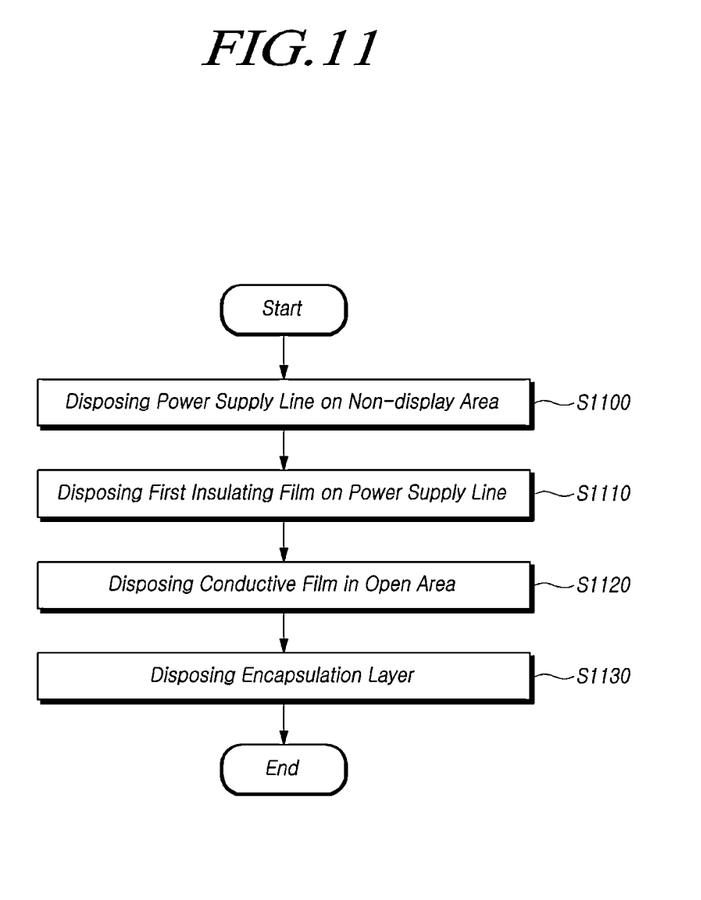
FIG. 11 is a flow chart for implementing the method of manufacturing the electroluminescence display device according to the present invention.

FIG. 11 is a flow chart for implementing the method of manufacturing the electroluminescence display device according to the present invention.

Referring to FIG. 11, on the substrate divided into a display area and a non-display area, the power supply line for supplying power supplied to the display area may be disposed on the non-display area. (S1100) In addition, the power supply line may be formed together when forming the source electrode 1126b and the drain electrode 1126a shown in FIG. 3. The power supply line may be formed by overlapping three metal layers. The power supply line may be, for example, a triple layer of titanium (Ti)/aluminum (Al)/titanium (Ti).

The power supply line may include the first power supply line for supplying the first power EVDD supplied to the pixel 101 shown in FIG. 2, the second power supply line for supplying the second power, and the reference voltage supply line for supplying the reference voltage. However, it is not limited thereto. Also, the first power supply line, the second power supply line, and the reference voltage supply line may be spaced apart from each other.

In addition, the first power supply line, the second power supply line and the reference voltage supply line may be respectively connected to the power link line. The power link line may include the bending pattern. The bending pattern may include two wires that alternately extend in the first direction (A) and the second direction (B) and cross each other. However, it is not limited thereto.

The first insulating film having the open area partially overlapping the power supply line may be disposed on the upper portion of the power supply line. (S1110) The first insulating film may be photo acryl (PAC). Also, the first insulating film 804 may be the planarization film 1127 illustrated in FIG. 4. A part of the power supply line may be exposed in the open area. The planarization film 1127 has a property of absorbing moisture, and moisture can be transferred by the planarization film 1127. However, since the planarization film 1127 is cut off by the open area, moisture may not be transferred by the cut off portion.

In the open area, the conductive film covering the first insulating film and the power supply line may be disposed. (S1120) The conductive film may protect the power supply line by covering the power supply line exposed in the open area. When forming the anode electrode 1131 shown in FIG. 3, since a part of the power supply line may be eroded during the etching process, and thus a predetermined space may be formed, the cracks may occur in the encapsulation layer disposed on the power supply line. In addition, moisture may penetrate into the display area through the crack.

However, when the conductive film is disposed on the power supply line, it is possible to prevent the power supply line from being eroded during the etching process for the anode electrode 1131. Therefore, the predetermined space may be not formed, so that the crack may not be formed in the encapsulation layer.

The conductive film 821 may be formed together when the anode electrode 1131 shown in FIG. 3 is formed. In addition, the conductive film 821 may be made of the same material as the anode electrode 1131. Further, the conductive film may be a triple layer of a transparent electrode/silver/transparent electrode.

In addition, the second insulating film may be disposed on one end and the other end of the conductive film 821, respectively. The second insulating film may be formed together when the bank 1132 shown in FIG. 4 is formed. In addition, the second insulating film may be made of the same material as the bank 1132. The conductive film may be fixed by the second insulating film.

The conductive film 821 may be formed together when forming the anode electrode 1131 shown in FIG. 4. In addition, the conductive film 821 may include the same material as the anode electrode 1131. However, it is not limited thereto. The conductive film 821 may prevent the power supply line 820 from being eroded when the anode electrode 1131 is formed. In particular, the silver included in the conductive film 821 is less reactive than the aluminum (Al) included in the power line, so that the erosion of the power supply line 820 can be prevented.

In addition, aluminum (Al) is vulnerable to electro-corrosion, but since the conductive film 821 including a material resistant to electro-corrosion, such as silver, is disposed, the film lifting phenomenon due to the electro-corrosion can be prevented.

In addition, the encapsulation layer can be disposed (S1130). The encapsulation layer may include the first inorganic film, the organic film, and the second inorganic film. The thickness of the organic film may be greater than the thickness of each of the first inorganic film and the second inorganic film.

The electroluminescence display device according to an embodiment of the present specification may include the substrate divided into a display area and a non-display area, the power supply line disposed in the non-display area for supplying power supplied to the display area, the first insulating film disposed on the power supply line and overlapping a part of the power supply line and having an open area where a part of the power supply line is exposed, and the conductive film covering the first insulating film and the power supply line in the open area.

The electroluminescence display device according to an embodiment of the present specification may further include the second insulating film disposed on one end and the other end of the conductive film respectively.

In the electroluminescence display device according to an embodiment of the present specification, the power supply line may include three overlapping metal layers.

The electroluminescence display device according to an embodiment of the present specification may further include the encapsulation layer disposed on the second insulating film.

In the electroluminescence display device according to an embodiment of the present specification, the conductive film may cover the inclined surface of the first insulating film and the power supply line.

The electroluminescence display device according to an embodiment of the present specification may further include, in the display area, the active layer, the gate insulating film disposed on the active layer, the gate electrode disposed on the gate insulating film and overlapping the active layer, the interlayer insulating film disposed on the gate insulating film on which the gate electrode is disposed, the source electrode disposed on the interlayer insulating film and contacting the active layer through a first contact hole formed in the interlayer insulating film, the a drain electrode disposed on the interlayer insulating film and contacting the active layer through a second contact hole formed in the interlayer insulating film, the protective layer disposed on the interlayer insulating film on which the source electrode and the drain electrode are disposed, the anode electrode disposed on the protective layer and connected to the source electrode through a third contact hole formed in the protective layer, the bank formed on the protective layer on which the anode electrode is disposed, and having a cavity overlapping the anode electrode, the light emitting layer disposed in the bank, the cathode electrode disposed on the light emitting layer, and the encapsulation layer disposed on the cathode electrode.

In the electroluminescence display device according to an embodiment of the present specification, the conductive film may include the same material as the anode electrode.

In the electroluminescence display device according to an embodiment of the present specification, the conductive film may include a triple layer of a transparent electrode/silver/transparent electrode.

In the electroluminescence display device according to an embodiment of the present specification, the second insulating film may include the same material as the bank.

In the electroluminescence display device according to an embodiment of the present specification, the bending area may be arranged in the non-display area, and the power link line including the bending pattern connecting the display area and the power supply line may be arranged in the bending area.

The method for manufacturing an electroluminescence display device according to an embodiment of the present specification may include the step for disposing, on the substrate divided into the display area and the non-display area, the power supply line for supplying power supplied to the display area on the non-display area, the step for disposing the first insulating film on the upper portion of the power supply line, the first insulating film having an open area overlapping a portion of the power supply line and exposing a part of the power supply line, and the step for disposing the conductive film covering the first insulating film and the power supply line in the open area.

In the method for manufacturing an electroluminescence display device according to an embodiment of the present specification, the second insulating film may be disposed on one end and the other end of the conductive film respectively, the bank may be disposed on the cathode electrode, and the bank may be formed together with the second insulating film.

In the method for manufacturing an electroluminescence display device according to an embodiment of the present specification, the encapsulation layer may be disposed on the second insulating film.

In the method for manufacturing an electroluminescence display device according to an embodiment of the present specification, the power supply line may include three overlapping metal layers.

In the method for manufacturing an electroluminescence display device according to an embodiment of the present specification, the conductive film may include a triple layer of a transparent electrode/silver/transparent electrode.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electroluminescence display device, comprising:
    a substrate divided into a display area and a non-display area;
    a power supply line disposed in the non-display area for supplying power supplied to the display area;
    a first insulating film disposed on the power supply line and overlapping a portion of the power supply line and having an open area where a part of the power supply line is exposed;
    a conductive film covering the first insulating film and the power supply line in the open area, and
    a second insulating film disposed on one end of the conductive film, and on another end of the conductive film located opposite the one end,
    wherein the display area comprises:
        an active layer;
        a gate insulating film disposed on the active layer;
        a gate electrode disposed on the gate insulating film and overlapping the active layer;
        an interlayer insulating film disposed on the gate insulating film on which the gate electrode is disposed;
        a source electrode disposed on the interlayer insulating film and contacting the active layer through a first contact hole formed in the interlayer insulating film;
        a drain electrode disposed on the interlayer insulating film and contacting the active layer through a second contact hole formed in the interlayer insulating film;
        a protective layer disposed on the interlayer insulating film on which the source electrode and the drain electrode are disposed;
        an anode electrode disposed on the protective layer and connected to the source electrode through a third contact hole formed in the protective layer;
        a bank formed on the protective layer on which the anode electrode is disposed, and having a cavity overlapping the anode electrode;
        a light emitting layer disposed in the cavity;
        a cathode electrode disposed on the light emitting layer; and
        an encapsulation layer disposed on the cathode electrode, and
    wherein the power supply line includes a first power supply line for supplying a first power, a second power supply line for supplying a second power and a reference voltage supply line for supplying a reference voltage, wherein areas in which the first power supply line, the second power supply line and the reference voltage supply line are disposed are divided into a first area, a second area, a third area and a fourth area, respectively, and wherein in the first area and the third area, the protective layer is not placed on the first power supply line, the second power supply line, and the reference voltage supply line; and in the second area and the fourth area, the protective layer is disposed on the first power supply line, the second power supply line, and the reference voltage supply line.

2. The electroluminescence display device of claim 1, wherein the power supply line includes three overlapping metal layers.

3. The electroluminescence display device of claim 1, further comprising an encapsulation layer disposed on the second insulating film.

4. The electroluminescence display device of claim 1, wherein the conductive film covers an inclined surface of the first insulating film and the power supply line.

5. The electroluminescence display device of claim 1, wherein the conductive film includes the same material as the anode electrode.

6. The electroluminescence display device of claim 5, wherein the conductive film includes a triple layer of a transparent electrode/silver/transparent electrode.

7. The electroluminescence display device of claim 1, wherein the second insulating film includes the same material as the bank.

8. The electroluminescence display device of claim 1, wherein a bending area is disposed in the non-display area, and a power link line including a bending pattern connecting to the power supply line in the display area, wherein the bending pattern of the power link line is disposed in the bending area.

9. The electroluminescence display device of claim 8, wherein the bending pattern includes two wires extending alternately in a first direction and a second direction and crossing each other.

10. The electroluminescence display device of claim 1, wherein the fourth area is disposed closer to the display area than the first area.

11. The electroluminescence display device of claim 1, wherein the conductive film is formed in the first area and the second area and not be formed in the third area and the fourth area.

12. A method for manufacturing an electroluminescence display device, comprising:
disposing, on a substrate divided into a display area and a non-display area, a power supply line for supplying power supplied to the display area on the non-display area;
disposing a first insulating film on an upper portion of the power supply line, the first insulating film having an open area overlapping a portion of the power supply line and exposing a part of the power supply line; and
disposing a conductive film covering the first insulating film and the power supply line in the open area,
wherein the display area comprises:
an active layer;
a gate insulating film disposed on the active layer;
a gate electrode disposed on the gate insulating film and overlapping the active layer;
an interlayer insulating film disposed on the gate insulating film on which the gate electrode is disposed;
a source electrode disposed on the interlayer insulating film and contacting the active layer through a first contact hole formed in the interlayer insulating film;
a drain electrode disposed on the interlayer insulating film and contacting the active layer through a second contact hole formed in the interlayer insulating film;
a protective layer disposed on the interlayer insulating film on which the source electrode and the drain electrode are disposed;
an anode electrode disposed on the protective layer and connected to the source electrode through a third contact hole formed in the protective layer;
a bank formed on the protective layer on which the anode electrode is disposed, and having a cavity overlapping the anode electrode;
a light emitting layer disposed in the cavity;
a cathode electrode disposed on the light emitting layer; and
an encapsulation layer disposed on the cathode electrode, and
wherein the power supply line includes a first power supply line for supplying a first power, a second power supply line for supplying a second power and a reference voltage supply line for supplying a reference voltage, wherein areas in which the first power supply line, the second power supply line and the reference voltage supply line are disposed are divided into a first area, a second area, a third area and a fourth area, respectively, and wherein in the first area and the third area, the protective layer is not placed on the first power supply line, the second power supply line, and the reference voltage supply line; and in the second area and the fourth area, the protective layer is disposed on the first power supply line, the second power supply line, and the reference voltage supply line.

13. The method for manufacturing an electroluminescence display device of claim 12, wherein a light emitting element including an anode electrode, a light emitting layer, and a cathode electrode is disposed in the display area, and the anode electrode is formed together with the conductive film.

14. The method for manufacturing an electroluminescence display device of claim 13, wherein a second insulating film disposed on one end of the conductive film on another end of the conductive film located opposite the one end.

15. The method for manufacturing an electroluminescence display device of claim 14, wherein an encapsulation layer is disposed on the second insulating film.

16. The method for manufacturing an electroluminescence display device of claim 12, wherein the power supply line includes three overlapping metal layers.

17. The method for manufacturing an electroluminescence display device of claim 12, wherein the conductive film includes a triple layer of a transparent electrode/silver/transparent electrode.

* * * * *

UNITED STATES PATENT AND TRADEMARK OFFICE
CERTIFICATE OF CORRECTION

PATENT NO.         : 11,812,631 B2
APPLICATION NO.    : 17/127274
DATED              : November 7, 2023
INVENTOR(S)        : Seokho Shim It is certified that error appears in the above-identified patent and that said Letters Patent is hereby corrected as shown below:

On the Title Page

Item (54) and in the Specification Column 1, Lines 1-5 should read:
--ELECTROLUMINESCENCE DISPLAY WITH SILVER CONDUCTIVE LAYER COVERING EXPOSED ALUMINUM LAYER TO PREVENT CORROSION AND MANUFACTURING METHOD FOR THE SAME--

Signed and Sealed this
Second Day of January, 2024

Katherine Kelly Vidal
*Director of the United States Patent and Trademark Office*